(12) United States Patent
Lee et al.

(10) Patent No.: US 6,831,296 B1
(45) Date of Patent: Dec. 14, 2004

(54) DEVICE FOR SEATING SEMICONDUCTOR DEVICE IN SEMICONDUCTOR TEST HANDLER

(75) Inventors: Ki Hyun Lee, Chungchongnam-do (KR); Seong Bong Kim, Chungchongnam-do (KR)

(73) Assignee: Mirae Corporation, Chunan-si (KR)

(*) Notice: Subject to any disclaimer, the term of this patent is extended or adjusted under 35 U.S.C. 154(b) by 0 days.

(21) Appl. No.: 10/713,110

(22) Filed: Nov. 17, 2003

(30) Foreign Application Priority Data

Jun. 14, 2003 (KR) .............................. 10-2003-0038530

(51) Int. Cl.[7] .............................................. H01L 23/58
(52) U.S. Cl. ............................ 257/48; 257/E21.521; 324/755
(58) Field of Search .......................... 257/48, E21.521; 324/755

(56) References Cited

U.S. PATENT DOCUMENTS 6,053,688 A * 4/2000 Cheng .................. 414/416.03
6,551,122 B2 * 4/2003 Bosy et al. ................. 439/348

* cited by examiner

Primary Examiner—David Nelms
Assistant Examiner—Tu-Tu Ho
(74) Attorney, Agent, or Firm—Fleshner & Kim, LLP

(57) ABSTRACT

A device for seating a semiconductor device in a semiconductor test handler is provided. The device includes a plate having a plurality of device seating members each for seating the semiconductor device. The device also includes a latch rotatably mounted to one side of the device seating member for pressing down or freeing the semiconductor device seated on the device seating member. A latch operating means for causing the latch to press down the semiconductor device when the semiconductor device is seated on the device seating member is also included. The provided device also releases the pressing down action when the semiconductor device is seated on the device seating member and when the semiconductor device is taken away from the device seating member, thereby seating the semiconductor device on the device seating device accurately and positively.

20 Claims, 6 Drawing Sheets

DEVICE FOR SEATING SEMICONDUCTOR DEVICE IN SEMICONDUCTOR TEST HANDLER

BACKGROUND OF THE INVENTION

This application claims the benefit of the Korean Application No. P2003-38530 filed on Jun. 14, 2003, which is hereby incorporated by reference.

1. Field of the Invention

The present invention relates to semiconductor test handlers for testing semiconductor devices.

2. Background of the Related Art

In general, after production of semiconductor devices such as, for example, memory or non-memory devices and modules having semiconductor devices mounted on a board to form a circuit, the semiconductor devices and modules are tested before shipment using a semiconductor test handler. Many of the semiconductor test handlers are designed to carry out not only general performance tests at room temperature, but also high temperature tests and low temperature tests. The temperature tests may include an extreme temperature state of high temperature or low temperature formed by using an electric heater or a liquefied nitrogen spray system, respectively, in an enclosed chamber. The semiconductor device or the module may be tested under such temperature extremes whether or not the semiconductor device or the module is normally operated in such an extreme temperature condition.

Figure 1:
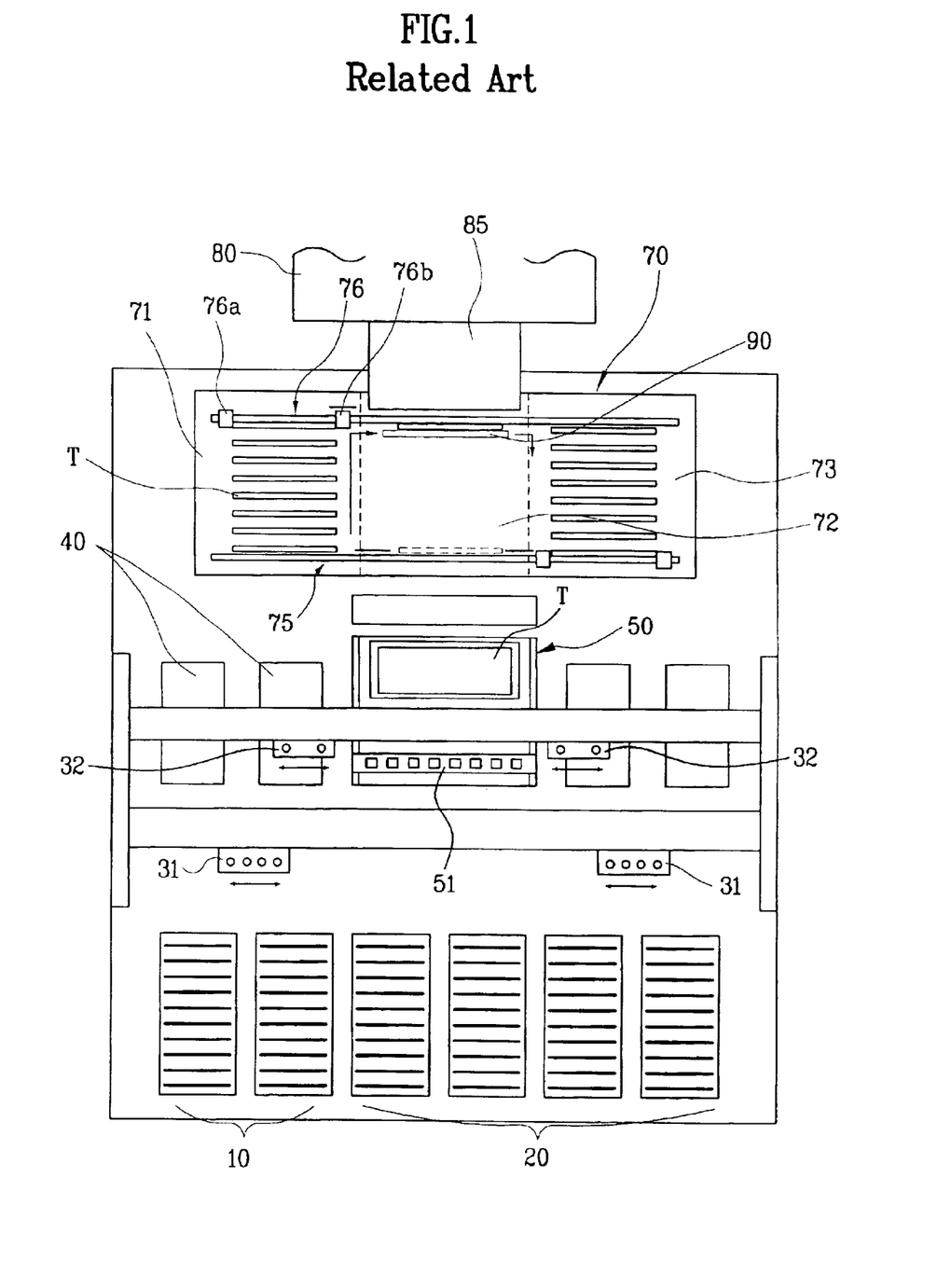
FIG. 1 illustrates a plan view of an exemplary semiconductor test handler.
Figure 2:
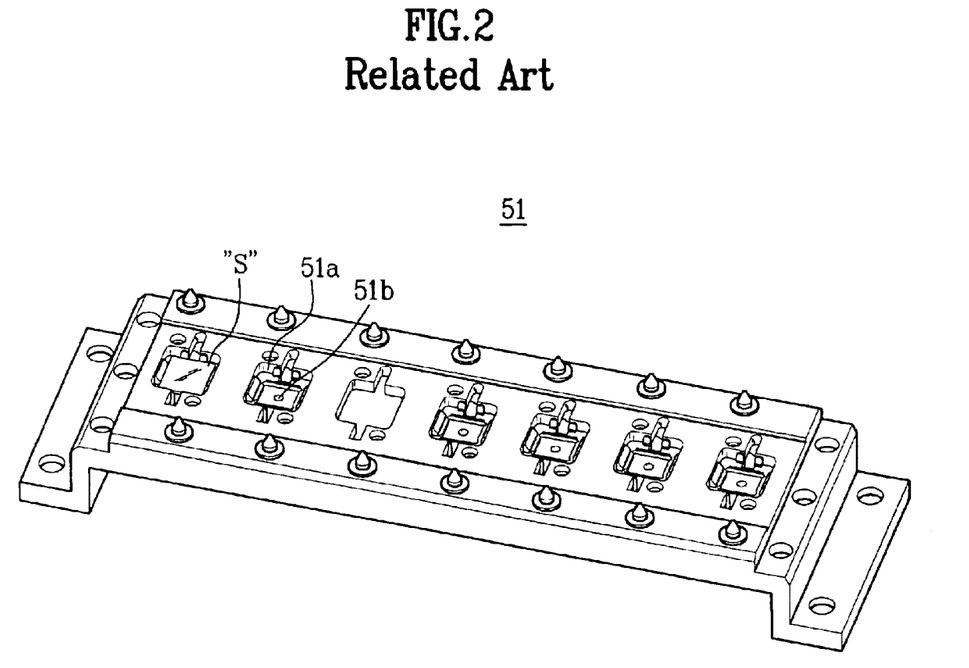
FIG. 2 illustrates a perspective view of an example of an alignment shuttle in a semiconductor handler.
Figure 3:
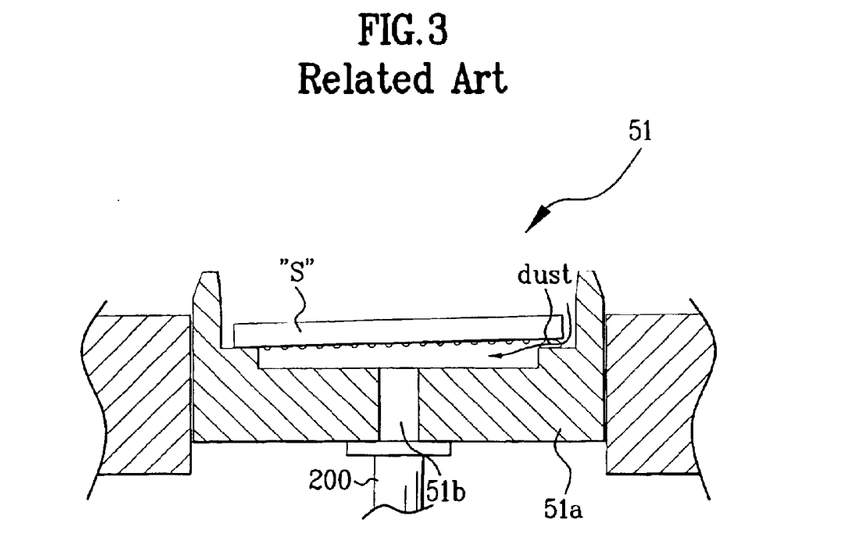
FIG. 3 illustrates a cross-section of an example of a semiconductor device improperly seated on a alignment shuttle.

FIGS. 1–3 illustrate exemplary systems of a semiconductor test handler or handler provided with loading stackers 10 in a front part of the handler for stacking user trays each having a plurality of semiconductor devices S to be tested thereon. The semiconductor test handler also includes unloading stackers 20 on one side of the loading stackers 10 having a stack of user trays. Each user tray has tested semiconductor devices S put thereon classified according to a result of a test.

On opposite parts of a middle part of the handler, there are buffer parts 40. Each buffer part 40 is mounted to be movable in front and rear directions for temporary mounting of the semiconductor devices S transferred from the loading stacker 10. In a center part of the middle part of the handler is an exchange part 50 for mounting the semiconductor device S to be tested. The semiconductor device S to be tested may be additionally transferred from the buffer part 40 on a test tray T. Such a transfer requires mounting the tested semiconductor device S mounted on the test tray T on the buffer part 40.

The handler also includes first pickers 31 and second pickers 32 between the front part having the loading stackers 10 and the unloading stackers 20 provided thereto. The first pickers 31 and second pickers 32 are also located in the middle part of the handler having the exchange part 50 and the buffet parts 40. The first pickers 31 and second pickers 32 are for making linear movement in X-axis, and Y-axis directions, and for picking up and transporting the semiconductor devices S. The first pickers 31 may access the loading stackers 10, the unloading stackers 20, and the buffers 40. The second pickers 32 may access the buffer part 40 and the exchange part 50 for picking up and transporting the semiconductor devices S.

In a rear part of the handler is a test site 70 having a plurality of enclosed chambers including a pre-heating chamber 71, a test chamber 72, and a defrosting chamber 73. The chambers are arranged for moving the test tray T having the semiconductor device S mounted thereon between them in a sequence after the high temperature or low temperature environment is formed therein. The chambers are for testing a performance of the semiconductor device S under test temperature conditions.

FIGS. 2 and 3 illustrate alignment shuttles 51 in the exchange part 50. The alignment shuttles 51 are for aligning the semiconductor devices S with spacing similar to the pitch in a device mounting carrier in the test tray T. The alignment shuttle 51 has a plurality of device seating blocks 51a arranged at regular intervals. The intervals are similar to the pitches in the carrier. The alignment shuttles 51 are designed to be movable back and forth to positions on the handler base under the test tray T and the second pickers 32. The alignment shuttles 51 are for receiving the semiconductor devices S on an upper surface of the device seating block 51a, and transferring aligned semiconductor devices S between the test tray T and the second picker 32.

There is a lower pushing unit under the exchange part 50. The lower pushing unit moves up the alignment shuttle 51 to mount the semiconductor devices S on the alignment shuttle 51 on the test tray T. The semiconductor device S is preferably arranged horizontally. Disposed over the exchange part 50 is an upper pushing unit for separating the semiconductor devices S from carriers on an upper side of the test tray T and mounting the semiconductor devices S back on the alignment shuttle 51. The lower pushing unit has a nozzle part 200 configured to come into contact with a bottom of the device seating block 51a and move the alignment shuttle 51 up or down. The nozzle part 200 is also configured to draw air through the through-hole 51b in the device seating block 51a for sensing positive seating of the semiconductor devices S.

Referring to FIG. 3, when the semiconductor device S is seated on the device seating block 51a of the alignment shuttle 51, a seating error may occur. Seating errors may be caused by dust or other debris or obstructions on a seating surface of the device seating block 51a or the semiconductor devices S being tilted or otherwise misaligned on the seating surface. A gap between the semiconductor device S and the seating surface results when there is a seating error. Such a gap may cause air leakage therethrough, and failure of a vacuum tight seal to form will occur. A handler control unit determines when a semiconductor device S is not seated properly, and stops operation of the handler for a worker to confirm a seating error when improper alignment is sensed. A stop of the handler operation caused by any false seating error, such as a misalignment sensing error, leads to a drop of productivity as well as reduced work efficiency of the worker as the test is delayed during the stopped time period.

SUMMARY OF THE INVENTION

An object of the invention is to solve at least the above problems and/or disadvantages and to provide at least the advantages described hereinafter.

Accordingly, the present invention is directed to a device for seating a semiconductor device in a semiconductor test handler that substantially obviates one or more of the problems due to limitations and disadvantages of the related art.

An object of the present invention is to provide a device for seating a semiconductor device in a semiconductor test handler which can make an accurate and positive seating of the semiconductor device on a seating device.

Another objection of the present invention is to provide a device for seating a semiconductor device in a semiconductor test handler for accurate and positive seating of the semiconductor device on a seating surface.

A further object of the present invention is to provide a device aligning shuttle for alignment of a semiconductor device before the semiconductor device is transferred to a required working position in a semiconductor test handler.

To achieve these objects and other advantages and in accordance with the purpose of the present invention, as embodied and broadly described herein, a device for seating a semiconductor device in a semiconductor test handler includes a plate having a plurality of device seating members each for seating the semiconductor device, a latch rotatably mounted to one side of the device seating member for pressing down or freeing the semiconductor device seated on the device seating member, and latch operating means for making the latch to press down the semiconductor device in a state the semiconductor device is seated on the device seating member, and to release the pressing down action when the semiconductor device is seated on the device seating member, and when the semiconductor device is taken away from the device seating member.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, and wherein.

DETAILED DESCRIPTION OF PREFERRED EMBODIMENTS

Figure 4:
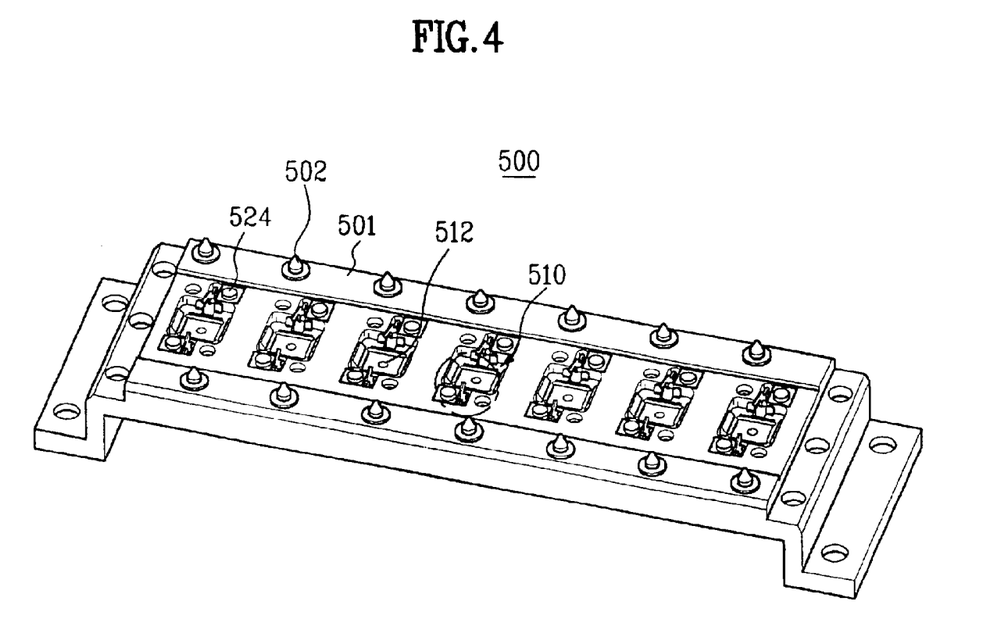
FIG. 4 illustrates a perspective view of a preferred embodiment of an alignment shuttle in accordance with the present invention.
Figure 5:
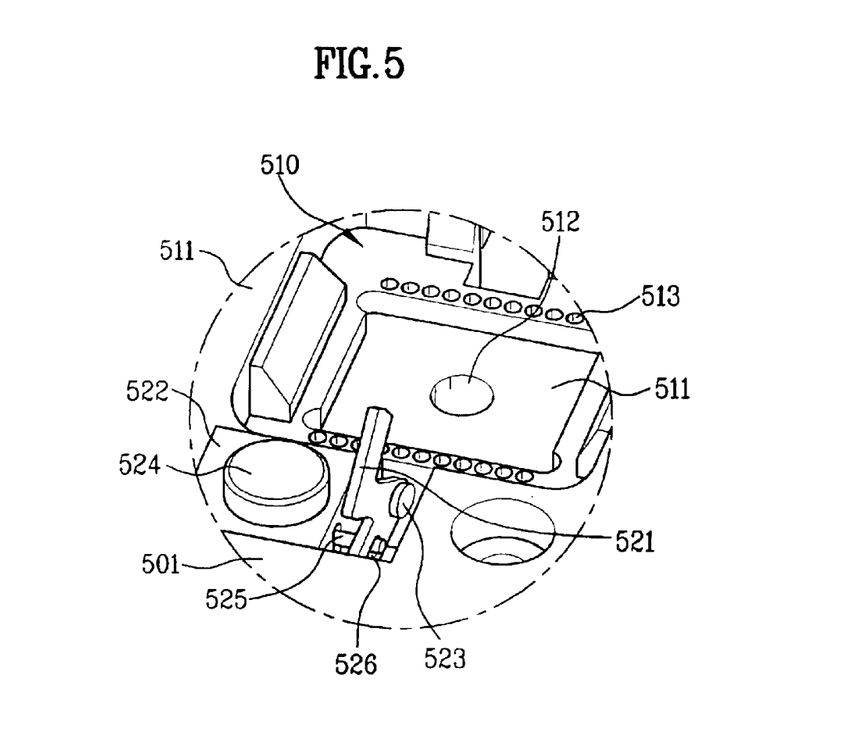
FIG. 5 illustrates an enlarged perspective view of a preferred embodiment of an alignment shuttle in accordance with the present invention.

FIGS. 4 to 10 illustrate a preferred embodiment of a device for seating a semiconductor device S in a semiconductor test handler in accordance with the present invention. The device for seating a semiconductor device S is also referred to as a seating device. FIG. 4 shows an alignment shuttle 500 for aligning semiconductor devices S to carrier pitches of test trays in a semiconductor test handler. The following description uses, as an example of a semiconductor devices S to be tested, a BGA type (Ball Grid Array Type) for convenience. However, it should be noted that the invention is equally applicable to any type of semiconductor device.

As shown in the preferred embodiment of FIGS. 4 to 10, a semiconductor device S alignment shuttle 500 in accordance with the present invention includes a plurality of device seating blocks 510 movably mounted in an up and down direction. The device seating blocks 510 are moveable within a limited distance in a long rectangular plate 501. Conical positioning pins 502 are also provided in correspondence to positioning holes 102 in carriers 100.

The device seating block 510 may have a recess 511 in an upper surface. The recess 511 may have a size slightly smaller than the semiconductor device S, and is sized for seating or supporting an edge of the semiconductor device S on an outer part of the recess 511. The recess 511 is defined by a ridge tracing a square on a surface of the device seating block 510 to form a space seating surface with a recess 511 in its central region. The device seating block 510 also has a through-hole 512 passing therethrough to a bottom thereof at a center of the recess 511 for serving as an air passage for forming a vacuum. There are a plurality of ball inserting holes 513 in the seating surface proximate the recess 511 for inserting an outer-most rows of balls B among the balls B of the semiconductor device S.

Also included in the seating device are at least one pair of latches 521 mounted on opposite sides of the semiconductor device seating block 510, which are rotatable in up and down directions. The latches 521 are configured for pressing down on opposite sides of the semiconductor device S from above when the semiconductor device S is seated on the device seating block 510.

Each latch 521 is substantially planar having a generally "Z" form with a long hole 526 in an outer end. The latch 521 also has a shaft hole through which a hinge shaft 523 protrudes. The latch 521 is mounted on a fixing block 522 on an outside of the semiconductor devices S seating block 510 such that the latch 521 may be rotated around a hinge shaft 523.

The fixing block 522 has an actuator such as an elevating part 524 mounted therein to be movable in an up and down direction. The fixing block 522 also includes a compression spring 527 mounted therein for elastically supporting the elevating part 524. There is also a pin 525 projecting from a side of the elevating part 524 which extends through the fixing block 522 and is inserted in the long hole 526 in the latch 521.

Accordingly, when the elevating part 524 moves up and down, the pin 525 on the elevating part 524 moves along the long hole 526 in the latch 521 and rotates the latch 521. In other words, when the elevating part 524 is elevated, because no external force is applied to the elevating part 524, the pin 525 is positioned at an outer end of the long hole 526 and causes an inner part of the latch 521 to move and press down upon the semiconductor devices S. When the elevating part 524 is pressed down by an external force, the pin 525 moves down with the elevating part 524, and slides to an inner end of the long hole 526 and rotates the latch 521, making the opposite latches 521 move apart.

Two parallel press bars 530 are provided over and across the alignment shuttle 500 at a position of the picker causing the semiconductor devices S to move down the elevating part 524 by pressing down a top part of the elevating part 524 from above the alignment shuttle 500. The picker then unloads the semiconductor device S on the alignment shuttle 500. Therefore, when the alignment shuttle 500 moves up to a position for receiving the semiconductor devices S from the picker, upper parts of the elevating parts 524 are brought into contact with the press bars 530 at the same time, and pressed down to cause the rotation of the latches 521.

Moreover, in addition to the up and down movement of the elevating part 524 taking place when the elevating part 524 is brought into contact with the press bars 530, the up and down movement of the elevating part 524 also occurs when the elevating part 524 is brought into contact with the carriers 100 of the test tray. This movement and contact may take place over the alignment shuttle, when the alignment shuttle exchanges the semiconductor device S with the carrier of the test tray.

Figure 6:
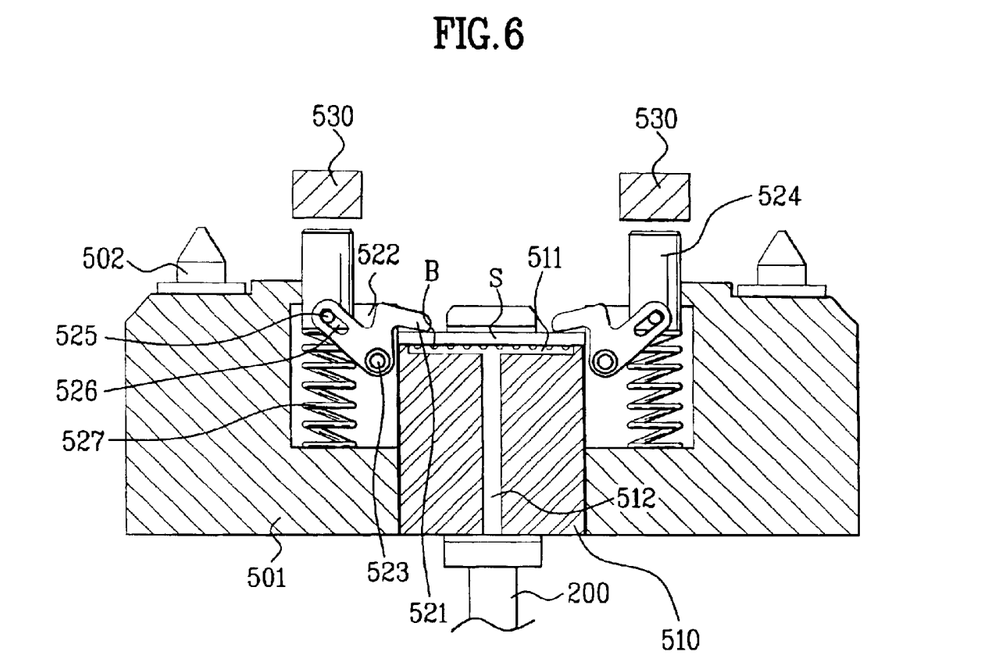
FIGS. 6 to 10 illustrate cross-sections of preferred embodiments of the invention showing exemplary operation steps of the alignment shuttle in accordance with the present invention.
Figure 7:
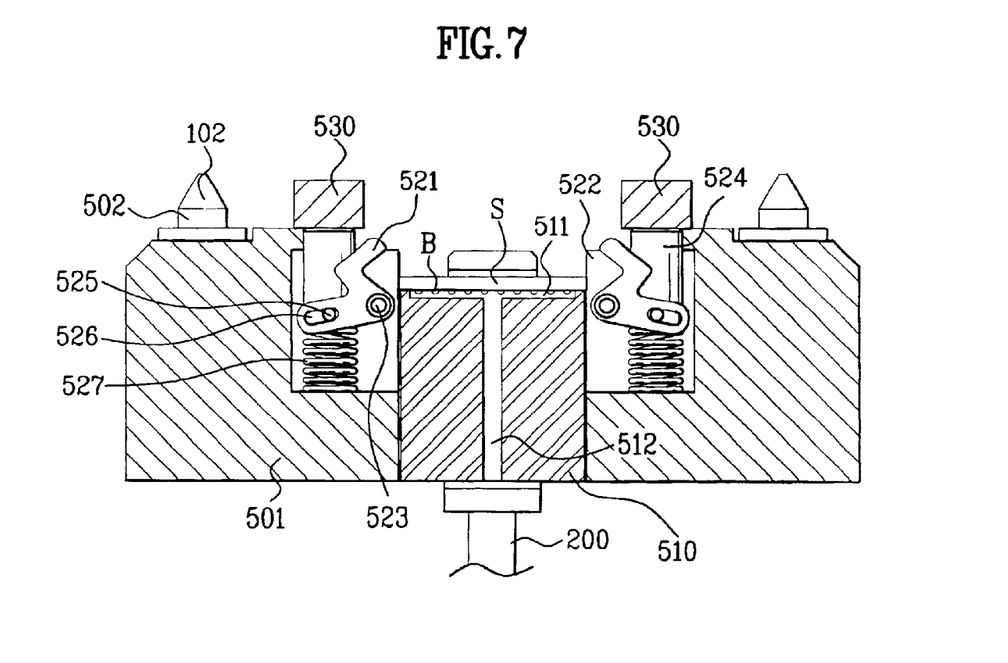

When it is intended to mount the semiconductor device S on the seating block 510 in the alignment shuttle 500, the alignment shuttle 500 is brought to a position for receiving the semiconductor device S from the second picker 32. When the alignment shuttle 500 is aligned under the second picker 32, the nozzle parts 200 of the lower pushing unit arranged under the alignment shuttle 500 are moved up and push the seating block 510 upward. Accordingly, the seating block 510 and the plate 501 move up, and, as shown in FIGS. 6 and 7, the elevating parts 524 move down as the top part of the elevating parts 524 are brought into contact with the press bars 530 which are fixed over plate 501 of the alignment shuttle 500.

As described above, the moving down of the elevating parts 524 rotates the inner sides of the latches 521 upward, and the latches 521 move apart from each other. In this position, the second picker 32 moves down and places the semiconductor device S on the seating block 510 in the alignment shuttle 500. After placing the semiconductor device S on the seating block 510, the second picker 32 moves up. Next, the alignment shuttle 500 moves down as the lower pushing unit moves down. The press bars 530 then raise and as the contact between the elevating parts 524 and the press bars 530 is released, the elevating parts 524 move up by the elastic force of the compression springs 527. The inner ends of the latches 521 simultaneously move down to press down the opposite end parts of the semiconductor device S. Accordingly, the semiconductor device S is positively pressed down on a surface of the seating block 510 by the pressure from the latches 521 and positively seats on the seating surface.

When the lower pushing unit starts to move down, air is evacuated from the through-hole 512 and the recess 511 in the seating block 510 through the nozzle part 200. The air evacuation process senses the presence of a semiconductor device S and whether the semiconductor device S is properly seated. During air evacuation, because the semiconductor device S is positively pressed down to the outer surface of the recess 511 by the latch 521, no leakage of air can be caused by foreign matter or misalignment. Thus, a vacuum may be formed at the nozzle part 200 when the semiconductor device S is properly seated, preventing mistaking in sensing the presence of the semiconductor device S or otherwise producing a false seating error.

When the semiconductor device S is seated on the seating block 510 in the alignment shuttle 500, the alignment shuttle 500 and a pushing unit move to a position under the test tray. As described above, the alignment shuttle 500 is positioned under the test tray and the nozzle part 200 of the lower pushing unit moves up, the alignment shuttle 500 also moves up.

Figure 8:
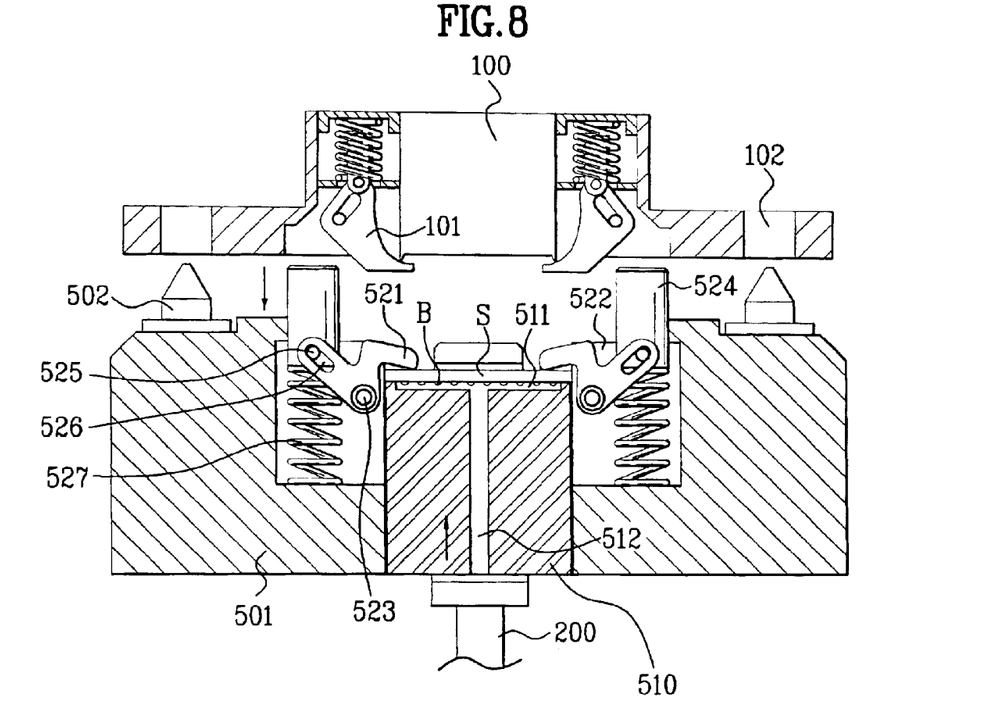
Figure 9:
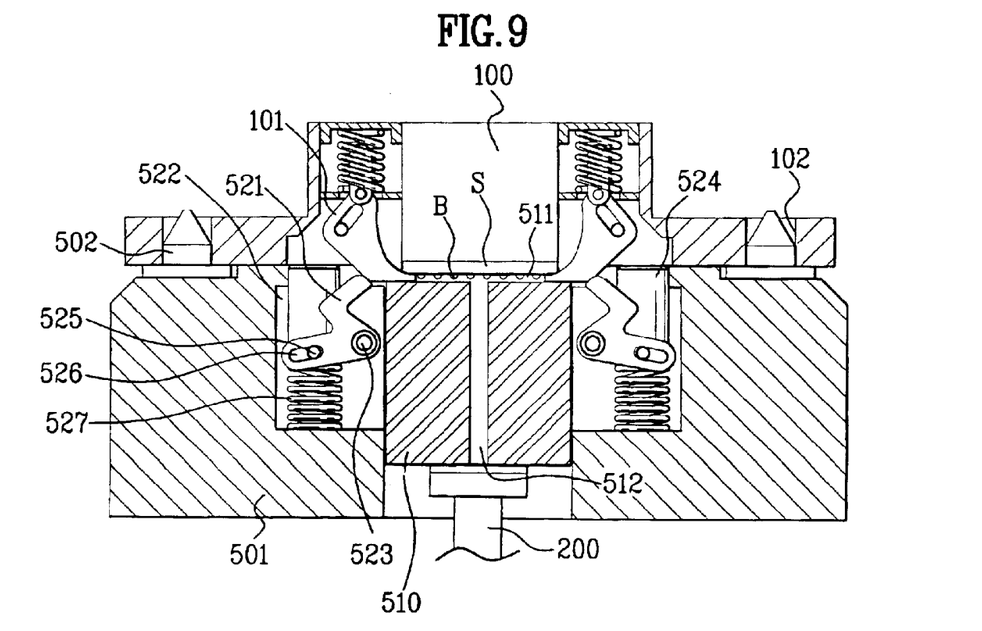

Referring to FIGS. 8 and 9, as the alignment shuttle 500 moves up, the elevating parts 524 move down as the top parts of the elevating parts 524 are brought into contact with the carrier 100 body. Contact by the elevating parts 524 then moves the latches 521 apart, and frees the semiconductor device S. When the nozzle part 200 moves further while the carrier 100 is in contact with the plate 501, the seating block 510 moves up slightly with respect to the plate 501, as shown in FIG. 9. With the seating block so positioned, the semiconductor device S on the seating block 510 is held at opposite end parts by carrier latches 101 as the carrier latches 101 move apart and come closer by a latch operating unit in the carrier 100.

With the semiconductor devices S held by the carrier latches 101, the alignment shuttle 500 moves down as the lower pushing unit moves down, and releases the contact between the elevating parts 524 and the carrier 100 body. When contact is released, the elevating parts 524 move up which moves the latches 521 closer to one another. As described above, a vacuum is formed in this configuration through the through-hole 512 and in the recess 511 in the seating block 510 by drawing air through the nozzle part 200. If a vacuum is formed when the air is drawn through the nozzle 200, it indicates that the carrier has failed to pick up the semiconductor device S from the alignment shuttle 500 and the semiconductor device S remains on the alignment shuttle 500. The nozzle part 200 detects and transmits the failure to fully unseat the semiconductor device S to the handler control unit to stop operation of the handler.

The alignment shuttle 500 receiving the semiconductor devices S from the carrier 100 of the test tray, and providing the semiconductor devices S to the second picker 32 is the reverse of the foregoing process.

Figure 10:
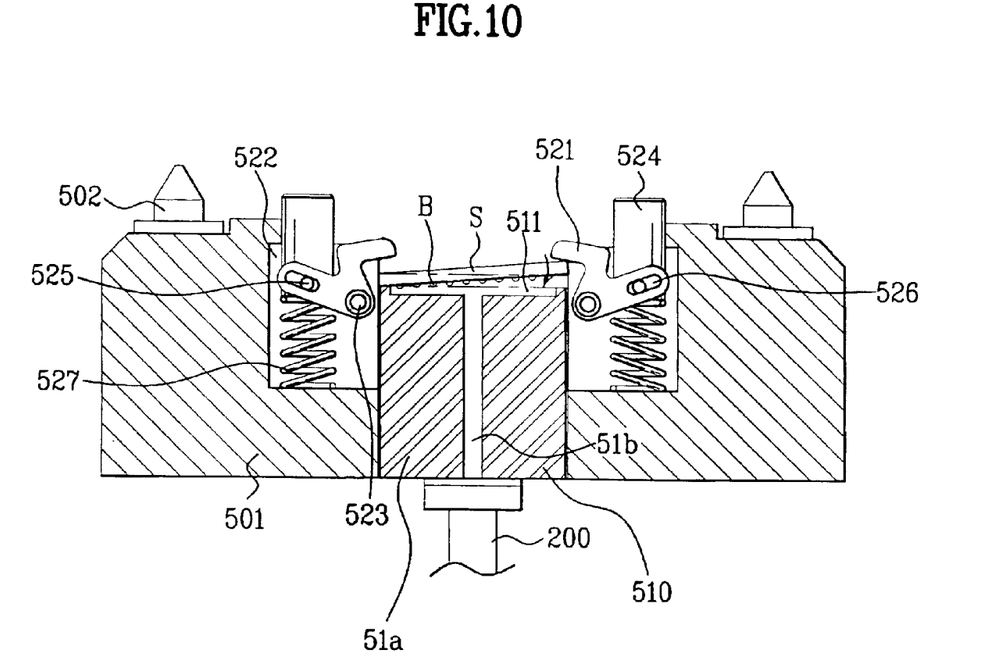

Referring to FIG. 10, the device for seating a semiconductor device S in a semiconductor test handler of the present invention has the advantage that if the semiconductor device S is tilted or misaligned relative to the seating block, a side of the semiconductor device S raises when the latches 521 come closer as the raised side is brought into contact with the respective latches 521. The latch 521 presses the raised side of the semiconductor device S into accurate alignment with the seating block 510. There is the additional advantage that no air leakage is caused by foreign matter as the semiconductor devices S is pressed down by the latches 521 when the semiconductor device S is seated on the alignment shuttle 500.

Though the foregoing description of the embodiment is directed to an application of latches to an alignment shuttle for pressing down a semiconductor device S when the semiconductor device S is seated, the latch and latch operation system are applicable to other semiconductor device S seating devices. Examples of other seating devices applicable to embodiments of the invention include a shuttle or a stage. An embodiment of the invention may also be used for temporary seating of a semiconductor device S in a recess during standby or transportation in devices other than the foregoing alignment shuttle using the same or similar steps and apparatuses.

Moreover, though the foregoing description of the embodiment is an example directed to a system in which the elevating part 524 moves up and down for operating the latches 521 as the elevating part 524 is brought into contact with the press bars 530 such as by a relative movement of the alignment shuttle 500 with respect to the press bars 530 fixed over the alignment shuttle. It should be noted that other systems may be provided in which the press bars 530 move up and down while the alignment shuttle 500 is fixed for moving up/down the elevating parts 524.

As has been described, a preferred embodiment of the invention allows the pressing down and releasing of the semiconductor device S by the automatic moving apart and the latches moving closer when semiconductor devices S are loaded or unloaded on or off the seating device. Accordingly, a preferred embodiment of the invention permits a semiconductor device S to make a positive surface to surface contact with a seating member of the seating device, and any inaccurate alignment can be detected and corrected when the semiconductor device S is misaligned.

Accordingly, in the case of a semiconductor device seating apparatus in which seating of the semiconductor device S is sensed by means of a vacuum, no operation interruption may be caused by incorrectly sensing absence of a vacuum, thereby improving a test efficiency.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus for seating a semiconductor device in a semiconductor test handler, the apparatus comprising:
   a plate;
   a plurality of seating portions on the plate, wherein each seating portion is configured to receive a semiconductor device;
   at least one latch arranged adjacent each seating portion and configured to press a semiconductor device into the seating portion;
   an actuator configured to cause the at least one latch to press a semiconductor device into the seating portion, and wherein the actuator is also configured to cause the latch to disengage from the semiconductor device so that the semiconductor device can be removed from the seating portion.

2. The apparatus as claimed in claim 1, wherein each seating portion comprises a through hole for forming a vacuum between the seating portion and a surface of a semiconductor device resting in the seating portion so that the semiconductor device can be held in the seating portion by the vacuum.

3. The apparatus as claimed in claim 2, wherein the seating portions further comprise a plurality of ball inserting holes for receiving the balls of a BGA-type semiconductor device.

4. The apparatus as claimed in claim 3, wherein the seating portions further comprise a recess on an upper side thereof, the recess being dimensioned to be smaller than the semiconductor device and being located so as to be entirely covered by the seated semiconductor device.

5. The apparatus as claimed in claim 1, wherein the at least one latch is movable between a first position where it presses a semiconductor device into a seating portion and a second position at which it releases the semiconductor device from the seating portion.

6. The apparatus as claimed in claim 5, wherein the latch is pivotable about an axis so that it can move between the first position and the second position, and wherein the latch actuator is configured to cause the latch to pivot between the first and second positions.

7. The apparatus of claim 6, wherein the latch actuator comprises an actuating member and a biasing member, and wherein a force can be applied to the actuating member to pivot the latch into the second position against the force of the biasing member, and wherein when no force is applied to the actuating member, the biasing member causes the latch to pivot into the first position.

8. The apparatus as claimed in claim 7, wherein the latch has an elongated hole and the actuating member has a pin partly inserted therein and extending through the elongated hole of the latch, so that as the actuating member is moved between first and second positions, the pin is moved along the elongated hole, thereby pivoting the latch.

9. The apparatus as claimed in claim 1, wherein two latches are arranged adjacent opposite sides of each seating portion.

10. A semiconductor test handler comprising an apparatus as claimed in claim 1.

11. An apparatus for seating a semiconductor device, comprising:
    a device seating block comprising a seating surface surrounding a recess in a first surface of the device seating block;
    a latch movably mounted proximate to the seating surface; and
    an elevating part coupled to the latch and configured to move the latch between open and closed positions, wherein the latch is configured to apply pressure to a semiconductor device to press the semiconductor device against the seating surface when the latch is in the closed position.

12. The apparatus of claim 11, wherein the elevating part comprises a protruding pin, wherein the elevating part is movable between first and second positions, wherein the latch comprises a substantially planar member having a slot therein, wherein the slot in the planar member receives the pin on the elevating part, and wherein movement of the elevating member between the first and second positions causes the latch to move between the open and closed positions.

13. The apparatus of claim 12, wherein the latch is pivotably mounted on the device seating block, and wherein the elevating part is configured to cause the latch to pivot between the open and closed positions.

14. The apparatus of claim 11, further comprising a biasing member mounted on the device seating block and configured to bias the elevating part toward the second position, which thereby causes the latch to move toward the closed position.

15. The apparatus of claim 14, wherein the elevating part is configured to be pressed by a press bar disposed above the elevating part towards the first position against the bias of the biasing member, which causes the latch to move towards the open position.

16. The apparatus of claim 11, wherein the seating surface comprises apertures therein configured to receive balls of a semiconductor device pressed thereupon.

17. The apparatus of claim 11, wherein the device seating block further comprises a through hole configured to apply a vacuum to a surface of a semiconductor device mounted in the recess.

18. An apparatus for seating a semiconductor device in a semiconductor test handler, the apparatus comprising:
    a plate;
    a plurality of seating portions on the plate, wherein each seating portion is configured to receive a semiconductor device;
    pressing means for releasably pressing a semiconductor device into a respective seating portion; and
    means for applying a vacuum to a surface of a semiconductor device mounted in the respective seating portion.

19. The apparatus of claim 18, wherein each seating portion comprises means for receiving solder balls on a surface of a semiconductor device mounted in the seating portion.

20. A test handler comprising the apparatus of claim 18.

* * * * *